United States Patent [19]

Chien

[11] Patent Number: 4,931,427
[45] Date of Patent: Jun. 5, 1990

[54] PROCESS FOR PRODUCING METAL OXIDE SUPERCONDUCTOR-POLYMER COMPOSITES AND COMPOSITES THEREBY FORMED

[75] Inventor: James C. W. Chien, Amherst, Mass.

[73] Assignee: Academy of Applied Science, Inc., Concord, N.H. ; a part interest

[21] Appl. No.: 144,525

[22] Filed: Jan. 15, 1988

[51] Int. Cl.$^5$ .................... C01B 13/14; C01F 17/00; C01G 3/02; C04B 35/64
[52] U.S. Cl. ........................................ 505/1; 252/500; 252/512; 252/518; 423/604; 423/635; 427/226; 505/734; 505/785
[58] Field of Search .............. 505/802, 803, 915, 813, 505/1; 252/500, 512, 513, 518; 427/226

[56] References Cited

U.S. PATENT DOCUMENTS

| | | | |
|---|---|---|---|
| 4,152,386 | 5/1979 | Winter | 505/802 |
| 4,533,685 | 8/1985 | Hudgin et al. | 252/513 |
| 4,610,808 | 9/1986 | Kleiner | 252/513 |
| 4,622,169 | 11/1986 | Rickle | 505/802 |
| 4,639,396 | 1/1987 | Semsarzadeh | 505/813 |
| 4,686,160 | 8/1987 | Yoshino et al. | 252/500 |

FOREIGN PATENT DOCUMENTS 0248432 12/1987 European Pat. Off. .

OTHER PUBLICATIONS

Engler, "Superconductivity at Accessible Temperatures", Chemtech, Sep. 1987, pp. 542-551.
Davison, "High Tc Superconducting Films from Metallo-Org.", MRJ Symposium Proceedings, vol. 99, Dec. 1987, pp. 289-292.
Gurvitch, "Preparation and Substrate Reactions of . . . Y-Ba-Cu-O", Appl. Phys. Lett. 51(13), Sep. 28, 1987, pp. 1027-1028.
Lindley, "Just Five Years from Superconductor Cable", Nature, vol. 327, Jun. 4, 1987, pp. 356-357.

*Primary Examiner*—Paul Lieberman
*Assistant Examiner*—John Boyd
*Attorney, Agent, or Firm*—Rines and Rines

[57] ABSTRACT

Process for producing metal oxide superconductor (MOS)-polymer (P) composites by (i) mixing a monomer and initiator with MOS followed by in-situ polymerization of the monomer, (ii) mixing MOS with a polymer solution followed by removal of solvent, (iii) blending MOS with a molten polymer and processing the MOS-P composite obtained by processes (i), (ii), or (iii) by extrusion or molding, and (iv) mixing MOS with monomers or prepolymers with or without catalysts to give MOS-P composite through reaction-processing, the polymers being one of all thermoplastic and thermoset resins, thermoplastic elastomers, or elastomers, the last with or without crosslinks. The MOS powdery materials are obtained by conventional ceramic technology or grinding the constituent metal oxides, sesquioxides, carbonates and nitrates and calcination, or MOS having free-standing continuous morphology obtained by the polymer precursor process disclosed herein or MOS with grafted polymer chains which is compatible or further grafted to the polymers of the composite.

A process for producing metal oxide superconductors (MOS) having free-standing continuous morphology through a polymer percursor method that includes (A) forming a solution of at least one metal ion complex of a polymer or copolymer in an organic solvent, (B) spinning into fiber or casting into film, (C) degradation of the polymer, and (D) oxidative calcination to obtain MOS having free-standing continuous morphology, the polymers having a backbone structure known to depolymerize or otherwise pyrolyze cleanly to volatile products above certain temperatures and containing one or more pendant groups which could complex or chelate metal ions by ionic or polar interactions. The metal elements are selected from the groups 2a, 3b and 1b of the Periodic Table and the metal-polymer complex is homogeneous and soluble in common polar organic solvent.

An important example of product is a free-standing oxygen deficient perovskite $Y_1Ba_2Cu_3O_x$, synthesized from polymer precursors and having a uniform crystalline morphology with connected frit texture. The decrease of resistivity with temperature is perfectly linear, the onset of $T_g$ occurs at 92.4K and $\Delta T_c$ (90%-10%) is ~1K and the material can be made in thin file or fiber form. Superconductive polymer composite has been obtained by filling the void or the material with monomer and initiator followed by polymerization of the occluded monomer.

7 Claims, No Drawings

PROCESS FOR PRODUCING METAL OXIDE SUPERCONDUCTOR-POLYMER COMPOSITES AND COMPOSITES THEREBY FORMED

The present invention relates to processes for forming superconductor composites and the composites thereby formed.

Emphasis is placed herein on metal-oxide superconductors (called "MOS") recently reported in journal articles authored by the following persons: J. G. Bednorz and K. A. Muller, Z., *Phys.* B64, 189 (1986); C. W. Chu, P. H. Hor, R. L. Meng, L. Gao, Z. J. Huang, Y. Q. Wang, J. Bechtold, D. Campbell, M. K. Wu, J. Ashburn, and C. Y. Huang, *Phys. Rev. Lett.* 58, 405 (1987); P. M. Grant, R. B. Beyers, E. M. Engler, G. Lim, S. S. P. Parkin, M. L. Ramirez, V. Y. Lee, A. Nazzal, J. E. Vazquez, and R. J. Savoy, *Phys. Rev.* B35, 7242 (1987); R. J. Cava, B. Batlogg, R. B. van Dover, D. W. Murphy, S. Sunshine, T. Siegrist, J. P. Remeika, E. A. Rietman, S. Zahurak, and G. P. Espinosa, *Phys. Rev. Lett.* 58, 1676 (1987).

For a long time there was steady but slow progress in finding superconducting materials of increasing critical temperature, $T_c$. These materials are mostly intermetallic alloys. An important discovery was made by Bednorz and Muller, above, that a La, Ba, Cu oxide of layered perovskite structure is superconducting with $T_c$ higher than 35K. In a short span of time MOS with $T_c$ in excess of 90K have been discovered. Examples are compounds of La, Sr, Cu and O, or Y, Ba, Cu and O prepared by ceramic technology such as grinding the appropriate metal oxides, sesquioxides, carbonates, and nitrates followed by calcining and sintering. However, according to this method, powdery MOS is obtained and there can be little if any control over the morphology, grain size, grain boundary and grain structures, or current density. The MOS powders are usually compressed and sintered into objects. It is particularly difficult to obtain fiber and film of small dimensions. The products obtained by such processes are friable and brittle.

Accordingly, it is an objective of the present invention to provide a process for forming new superconductors in which there is significant control over the morphology, grain size, grain boundary and grain structure of the resulting superconducting product.

Another objective is to provide a superconducting material than can, with relative ease, be formed into fibers, films and the like, especially of small dimensions, which are less brittle and less friable than products now available.

Still another object is to provide a superconducting material in the form of a metal oxide superconductor-polymer (MOS-P) composite which can be formed into the many configurations needed in the general electrical technological and the computer fields and including fibers (or wires), coatings and films and the like.

These and still further objectives are addressed hereinafter.

The foregoing objectives are attained, generally, in a metal-polymer complex, the polymer being a polymer that forms soluble complexes with the metal ions in the metal-oxide superconductor. The objectives are attained also in the process for making the metal-polymer complex.

The invention, in summary, is directed to a process which produces MOS with free-standing continuous morphology through polymer precursors; the ultimate product may be produced by spinning or casting a solution of a metal polymer complex; pyrolyzing the resulting precursor fiber or film; and oxidative calcination into free-standing continuous MOS. This invention is also directed to methods of producing metal oxide superconductor-polymer (i.e., MOS-P) composites of various shapes and forms; the composites have improved stability, mechanical strength, and physical properties. The MOS-P composite can be produced a number of different ways, that include: (i) mixing a monomer and initiator with MOS followed by in situ polymerization of the monomer, (ii) mixing MOS with a polymer solution followed by removal of solvent, and (iii) blending MOS with a molten polymer and processing the MOS-P composite obtained by process (i), (ii), or (iii), by extrusion or molding; and (iv) mixing MOS with monomers or prepolymers with or without catalysts to obtain the MOS-P composite through reaction-processing. All known polymers can be used in this invention including thermoplastic resins, thermoset resins, thermoplastic-elastomers, and elastomers which require or do not require crosslinking. The MOS are superconducting oxides that include elements of groups 2a, 3b, and 1b of the Periodic Table, either in powdery form or having free-standing continuous morphology or MOS with grafted polymer chains; and other element combinations which form superconducting substances are not excluded from this invention. The MOS-P composites of this invention utilize the powdery MOS or the free-standing continuous MOS or the MOS with grafted polymer chains.

The novel idea of this invention was conceived from the observation that the free-standing MOS with fritted morphology obtained with the polymer precursor process herein disclosed has excellent superconducting properties without further compression; thus the superconducting domains are connected and should not be impeded by filling the voids of the materials with polymers to form MOS-P composite. This notion led to the important observation that even a blend of MOS powder, obtained by the traditional ceramic technology or by pulverizing the free-standing continuous MOS material, yielded a superconducting MOS-P composite.

The metal-polymer complex process produces MOS having a free-standing continuous morphology, with controlled grain structures, and improved critical current density ($J_c$) by forming a solution of metal polymer complex, spinning it into a fiber or casting it into a film, and converting it to MOS.

The present inventor conducted studies to find a novel process for producing MOS which enables control over the morphology, grain structures, shape, and forms by spinning or casting a solution of a metal polymer complex, pyrolyzing, and oxidizing to yield MOS having controlled grain sizes from large grain size to small grain size (the grain size can determine the electric-current density of the MOS)—in a free-standing structure. It has been found for present purposes that the superconducting oxides are interconnected. They can be made, for example, into foam-like films and fibers, but initial studies show room for improvement in degree of brittleness and sensitivity to moisture, though they are most useful for some purposes and also readily serve as precursors for the superconductors-polymer composites that are discussed in great detail below. It should be noted that the polymer-metal complex process can be utilized to form thin MOS films either by itself or on semi-conductor surfaces including Silicon wafers or to receive a metal by-pass sheath. The materials formed according to the discussion to follow are mechanically strong and resistant to moisture intrusion. In at least one case, a porous free-standing superconductor is treated in a manner that renders it mechanically strong and resistant to moisture. Emphasis below is on ways of providing a passivated superconductor material as a superconducting structure—a free-standing structure.

The aspect of the present invention now discussed includes (A) forming a solution of at least one metal ion complex of a polymer or copolymer in an organic solvent, (B) spinning into fiber or casting into film, (C) pyrolysis of the organic polymer component, and (D) calcining in the presence of oxygen the resulting material to the superconducting states. The polymers useful in this invention have: (I) backbone structures known to depolymerize of otherwise pyrolyze cleanly to volatile products above certain temperatures, and (II) pendant groups which could complex or chelate metal ions by ionic or polar interactions. Also useful are copolymers of two monomers, one of which possesses the (I) requirement or both (I) and (II) requirements. The monomers are selected from the groups that include vinyl esters, vinyl acids, aldehydes, cyclic acetals, acrylonitriles, α-alkyl styrenes and ε-caprolactamus having carboxylic, sulfonic, hydroxy, acetylacetanato, ether, amide, and nitrile complexation functionalities either in the pendant group or in the backbone. The metal elements include those of group 2a, 3b and 1b of the Periodic Table. One common characteristic of polymer is the ability to form homogeneous and soluble complexes with desired ions (M) in the appropriate ratio. Three different metal ions are contained in metal polymer complex of this invention such as La, Sr and Cu. Another set of metal ions for the precursor synthesis are Y, Ba and Cu. Other sets of metal ions can be used as new superconducting structures are discovered; the present invention contemplating other such structures.

The ratio of the number of metal ions per polymer chain is varied to control the rates of nucleation, of grain growth, and of the morphology desired for the physical, mechanical and electrical properties of the MOS. The concentration of the metal polymer composite is adjusted so that the solution has a viscosity suitable for fiber spinning film casting. After calcination, the fiber or film produced has the frit texture with the same $T_c$ and X-ray diffraction patterns published for the particular MOS.

The criteria for the choice of the polymeric carrier to form the metal polymer complex are that the polymer be of sufficient molecular weight, i.e., greater than about 10,000, so that its solution has adequate viscosity for spinning and casting into fibers and films, respectively; and that the polymer and the set of metal compounds will co-dissolve in a common solvent to form a clear homogeneous solution. That molecular complexes or chelates are formed between the polymer and the metal ions is indicated by the clarity and transparency of the fiber or film obtained after solvent evaporation, indicating the absence of precipitated metal compounds or other separation into two or more phases The polymer, moreover, should be of the type which thermolyzes cleanly and primarily into its constituent monomer. The last criterion is met by substances such as polymers and copolymers of methacrylic acid, acrylic acid, atropic acid, citraconic acid, methylene malonic acid, αmethyl styrene sulfonic acid, ε-caprolactam and acrylonitriles or aldehydes, cyclic ethers, and cyclic acetals having said metal complexing or chelating functional pendant substitutents.

The metal compounds should be in the correct stoichiometry for the preparation of the metal polymer complex. For instance, the ratios of the yttrium, barium and copper compounds should be 1:2:3 for the preparation of $Y_1Ba_2CU_3Ox$ MOS, where x is close to seven. The amounts of the metal compounds to be complexed with the polymeric carrier may be varied broadly as a way to control the rate of nucleation of the MOS and consequently the grain size, morphology, gross density, and number of surface functional groups. Further controls are possible through the usage of appropriate rates, durations, and the final temperatures of the pyrolysis, the oxidative calcination and the annealing processes.

The MOS is endowed with hydroxyl surface groups of between 0.1 to 10 micromoles per gram of MOS. They could contribute to the long term instability of the material. The groups can be functionalized for passivation and improved adhesion. Some examples follow.

EXAMPLE 1

Purified acrylic acid (40 g), methyl methacrylate (10 g) and azo-bis (isobutyronitrile) (0.5 g) was polymerized at 60° C. for two hours. While fibrous acrylic acid-methylmethacrylic copolymer (35 g) was precipitated with 200 ml of methanol and 2 liters of acetone; it was dried overnight at 80° C. Poly(acrylic acid-co-methyl methacrylate) (9.72 g) ipthium nitrate pentahydrate (3.65 g), barium iodide dihydrate 8.54 g and copper nitrate trihydrate (7.25 g) were co-dissolved in dimethyl formamide (100 ml). The solution was cast on glass plate and solvent evaporated to form a precursor film.

The precursor film was heated in an alumina boat at 400° C. for two hours under a flowing stream of nitrogen followed by heating at 950 ° under oxygen for twelve hours and slow cooling over five hours to ambient temperature. The resulting free-standing fritted film has physical integrity and mechanical strength and is superconducting without further treatments such as pelletization under pressure or pulverizing and pelletization. The MOS material is characterized by linear decrease of resistivity with decreasing temperature above $T_c$ of 95K and very sharp transistion of about 1K at $T_c$.

EXAMPLE 2

Purified poly(methyl methacrylate) (100 g) was dissolved in 500 ml of dimethylacetamide and aqueous NaOH added. The hydrolysis was performed at room temperature for two hours. After neutralization with aqueous HCl, washing and drying, 80 g of polymer was isolated. Analysis showed the material to contain 75% of methacrylic acid units and 25% of methyl methacrylate units. This copolymer was used to prepare metal complex and conversion to MOS as in Example 1.

EXAMPLE 3

Purified methacrylic acid (50 g) and azo-bis-(isobutyrolnitrile) (0.5 g) was polymerized at 60° C. for two hours. White fibrous poly (methacrylic acid) (35 g) was precipitated with 200 ml of methanol and 2 liters of acetone; it was dried overnight at 80° C. This polymer was used to prepare metal complex which is transformed into MOS as described in Example 1.

EXAMPLE 4

The metal polymer complex solution of Examples 1 to 3 was used as the spinning solution. After defoaming, the solution was extruded from a spinning nozzle of 100 micron diameter. The extrudate was allowed to pass vertically through an oven kept at 150° C. and wound at 10 meter/minute in air. The precursor fiber thus obtained was transparent and had a diameter of 30 micron. It was converted to MOS fritted fiber possessing superconducting properties as given in Example 1.

To summarize the foregoing to some extent, recently metal oxide superconductors have been prepared by the traditional ceramic techniques of sintering inorganic metal salts followed by firing at elevated temperature. A variety of MOS has been discovered; a well known example is the oxygen deficient $Y_1Ba_2Cu_3O_7$ having a perovskite structure and a critical temperature ($T_c$) of about 98K. By this method, it is difficult to control grain structure (size, boundary, etc.) and only powdery substances were obtained.

The present invention is a new process for the synthesis of MOS utilizing high molecular weight polymers having functional groups which will solubilize the desired metal compounds in appropriate stoichiometric ratios. The polymer-metal complex is soluble in polar organic solvents such as dimethyl formamide, dimethacetamide N-methyl pyrolidone and sulfolan. Polymers which will serve these functions are poly (acrylic, poly(methacrylic acid) and poly (styrene sulfonic acid). Copolymers of these acidic monomers can be used in the above context provided the latter is present in sufficient amount to complex with the metal compounds. Also included in this invention are copolymers of maleic anhydride, citronic anhydride, and other monomers hydrilyzable to the corresponding acid. The polymer precursor solution is cast to form homogeneous transparent film. The film is heated under nitrogen to 500° C., then under oxygen to 850° C. to 950° C. to give a product with a foam morphology, variable grain sizes and variable hydroxyl content. In the case of $Y_1Ba_2Cu_3$ MOS product the resistivity decreases linearly with decreasing temperature until at $T_c \sim 95K$ it becomes superconducting and exhibits the characteristic Meissner effect. The flotation density is $6.0 \pm 0.2$ g cm$^{-3}$.

The invention, among other things, allows variation of the metal ions to polymer ratios over a broad range. This ratio can determine the rates of nucleation and crystal growth, the grain size and structure, and also the density of the foam morphology. Therefore, crystallite sizes from 100 micrometers down to fractions of a micrometer have been obtained. MOS having surface hydroxyl contents between 1 micromole/g to 1 m mole/g can be prepared which means large variation of grain structures.

An important aspect of the invention is directed to produce MOS-polymer composite by several processes. The in-situ polymerization process (i) above can be achieved by many methods known to the art: (a) MOS is mixed with vinyl monomers and polymerized with peroxide, persulfate, azo, redox or ionic initiators, (b) MOS is mixed with diols, chain extenders, diisocyanates and polymerization catalyzed by alkyltin esters; (c) MOS is mixed with phenols or substituted phenols and formaldehyde and thermally polymerized; (d) MOS is mixed with diene monomer containing transition metal catalysts and crosslinking agents such as peroxide, bisazido compounds and the diene is polymerized by a coordinated ionic mechanism followed by thermal crosslinking.

In the process (ii) above, MOS is mixed with any polymer dissolved in a suitable solvent; the latter is subsequently removed under vacuum and heating MOS and polymer are simply blended thermomechanically in the process (iii). In the process (iv) the polymerization occurs by mixing two components of a system in a twin extruder. For instance, a mixture of diols and chain extender is mixed with diisocyanate and catalyst both containing the requisite MOS and the reacting composite extruded Another example is reaction-processing of one component containing MOS, norbornene and tungsten catalysts with a second component containing MOS, norbonene, and alkyl aluminum chloride cocatalysts.

The processes (ii) and (iii) above are preferred polymers of gaseous monomers (ethylene, propylene, tetrafluoroethylene, etc.), for polymerizations eliminating $H_2O$, alcohol, phenols or HCL (polyamide, polyesters, polycarbonates, polysiloxanes, etc.), or for processes otherwise impractical through process (i) and (iv), such as block copolymers obtainable with living ionic polymerizations.

Superior physical-mechanical properties of composite are obtained by (1) grafting polymer chains in the surface of the filler, the chain being the same as or compatible with the polymer component; (2) the graft polymer chains of the filler in (1) are further grafted to the polymer component of the composite; or (3) by connecting the filler particles with chemical bonds. There was found between 0.1 to 10 micromoles of hydroxyl groups in the surface of MOS represented as (MOS)OH. The following reactions are used to effect the grafting processes either in the presence of a monomer or without one:

metallation to form (MOS)O$^-$ with Na$^+$ or Li$^+$ counter ion;

phosphogenation to form (MOS)OC-NHRNCO;

reaction with arylene or alkylene diisocyanate to form

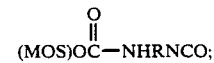

direct polymerization of aldehyde monomers catalyzed by quaternary ammonium ions.

The reactive surface species are used in the process (1) to initiate the graft polymerization of a suitable and appropriate monomer. These surface species are also used in the process (3) to react with telechelic polymers having the appropriate terminal functional groups. The in-situ polymerization process (i) above of monomer in the presence of MOS having polymer chains, as obtained by the processes (1) and (3), resulted in their grafting to the polymers of the composite (process (2)). Some examples follow.

EXAMPLE 5

Free-standing $Y_1Ba_2Cu_3O_{9-x}$ having fritted continuous morphology with 20% void volume was prepared by the polymer precursor method. Four fine wires of platinum (Pt) were attached to the MOS, then the voids were filled with methyl methacrylate containing 1% of azobis (isobutyrolnitrile) under vacuum. After rinsing off the excess monomer with methylene chloride, the monomer in the void was polymerized to completion.

The resulting MOS-P composite has a $T_c$ of about 90K (92.4k and $\Delta T_c$[90%–10%[of ~ 1K with a decrease of resistivity with temperature that is perfectly linear.

EXAMPLE 6

MOS was saturated with isoprene containing 0.1% each of $VOCl_3/(C_2H_5)_2$ AlCl and di-t butyl peroxide as in Example 1. Isoprene was polymerized first and then heated to 120° C. to effect peroxide-initiated crosslinking. The MOS elastomer composite is superconducting.

EXAMPLE 7

Fine particles of MOS were mixed with 30 volume % of nylon 66 in a brabender and then compression molded with four fine wires of Pt. The resulting film of MOS-nylon composite is superconducting.

EXAMPLE 8

Mos of Example 5 was saturated with a $CH_2Cl_2$ solution of toluene diisocyanate containing a small amount of dibutyl tin dilaurate. After two hours of reaction at 60° C., the unreacted diisocyanate was removed by refluxing $CH_2Cl_2$ and then the solvent removed by evacuation. A solution of t-butyl hydroperoxide was then introduced into the MOS. After complete carbonylation, the unreacted hydroperoxide and solvent were removed as above. One volume percent of methyl methacrylate was introduced and heated to polymerize to obtain MOS having grafted poly(methyl methacrylate) chain). Finally, the material was saturated with ethyl methacrylate containing 1% of cumyl hydroperoxide and polymerized as in Example 1.

EXAMPLE 9

The MOS of Example 4 having grafted poly(methyl methacrylate) was refluxed with $CH_2Cl_2$ in a Soxhlet extractor to remove ungrafted poly(methl methacrylate). After drying, the MOS material was filled with acrylonitrile containing potassium persulfate and polymerized.

EXAMPLE 10

A suspension of MOS particles in $CH_2Cl_2$ solution of toluene diisocyanate containing 1% dibutyl tin dilaurate was reacted at 60° C. The product was washed repeatedly with dry $CH_2Cl_2$ and resuspended in a $CH_2Cl_2$ solution of $\alpha$, $\omega$ dihydroxy telechelic polymer of tetrahydroferan (MW 2000), the amount of hydroxy group being equal to the surface isocyanato groups in MOS. The coupling reaction was conducted in the presence of tin catalyst. The final product was washed and dried and used for preparing MOS-polymer (MOS-P) composites.

The materials produced in accordance with the foregoing examples have advantages over the ceramic technology in the prior art in that the process of the present invention disclosed, among other things, enables one to control grain size and to obtain shapes of the MOS and MOS composites.

Further modifications of the invention herein disclosed will occur to persons skilled in the art and all such modifications are deemed to be within the scope of the invention as defined by the appended claims.

What is claimed is:

1. A process for producing copper based metal oxide superconductors having continuous foam-like morphology, that comprises, co-dissolving solutions other than metal oxides containing metal ions with a polymer or copolymer in an organic solvent in which said solutions and polymer or copolymer are soluble and of a polar organic solvent type selected rom the group consisting of dimethyl formamide, dimethacetamide N-methyl pyrolidone and sulfolan, the said polymer or copolymer being selected from the group consisting of (poly)acrylic acid, (poly)methacrylic acid, (poly)styrene sulfonic acid, and copolymers of malonic acid, citraconic acid, acrylonitriles, E-caprolactam, cyclic ethers and cyclic acetals having metal complexing or chelating functional pendant substituents, and a copolymer of vinyl acetate and acrylic acid, and the metals being of the type susceptible of forming high transition temperature metal oxide superconductors with at least some selected from the group consisting of Y, Ba, La and Sr and with the weight ratio of polymer to metal compound being of the order of about two to four-to-one; said process further comprising sequentially driving off the solvent thermally degrading the polymer component of the precursor into volatile fragments, and heating under oxygen to transform the metal compounds into metal oxide superconductors, thereby providing an integral metal oxide superconductor with interconnected substantially uniform size grains extending along the resulting continuous foam-like morphology.

2. A process as claimed in claim 1 and in which the degrading is effected first by heating at temperatures of the order of 500° C. in a nitrogen atmosphere followed by heating at a temperature of the order of 900° C. in a oxygen atmosphere.

3. A process as claimed in claim 1 and in which the ratios of metal ions to polymer is varied to vary the grain size and structure of the superconductor.

4. A process as claimed in claim 1 and in which the polymer complex has one of carboxylic, ether and amide groups.

5. A process as claimed in claim 1 and in which the voids of the foam-like morphology are filled with monomers such as diene and oligomers thereof and the same are polymerized.

6. A method as claimed in claim 1 and in which the metals selected are those of Y, Ba and Cu and in the proportions to produce the metal oxide superconductor $YBa_2Cu_3O_{7-x}$.

7. A process as claimed in claim 1 and in which the metal ion solutions are nitrates of the metal.

* * * * *